United States Patent [19]
Hutson

[11] 3,864,584
[45] Feb. 4, 1975

[54] HIGH SPEED PROGRAMMABLE DRIVER CIRCUIT

[75] Inventor: David J. Hutson, Apalachin, N.Y.

[73] Assignee: International Business Machines Corporation, Armonk, N.Y.

[22] Filed: Nov. 29, 1973

[21] Appl. No.: 420,120

[52] U.S. Cl. .................. 307/268, 307/237, 307/263, 307/317

[51] Int. Cl. .............................................. H03k 5/12

[58] Field of Search ........... 307/237, 262, 268, 270, 307/317, 263

[56] References Cited

UNITED STATES PATENTS 3,573,502 4/1971 Kan................................ 307/270 X

*Primary Examiner*—John Zazworsky
*Attorney, Agent, or Firm*—Gerald R. Gugger

[57] ABSTRACT

A programmable driver circuit includes a constant current generator, a switching circuit and first and second hot carrier diodes connected to first and second limit voltages to control turn-on and turn-off delay in the switching circuit within predetermined tolerances. A current mode switch is used in the input circuit to control the switching circuit and a complementary emitter follower circuit is connected as an output circuit to supply the necessary load current.

1 Claim, 2 Drawing Figures

HIGH SPEED PROGRAMMABLE DRIVER CIRCUIT

BACKGROUND OF THE INVENTION

The present invention relates to semiconductor circuits and more particularly to semiconductor digital switching circuits.

In the prior art, high speed pulse driver circuits were subject to wide variations in pulse rise time ($t_r$), fall times ($t_f$), turn-on delay ($t_d$ on), and turn-off delay ($t_d$ off).

In high speed circuits these parameters are sometimes very critical to the operation of the circuit and must be controlled within predetermined limits for proper circuit operation.

Therefore, it is a primary object of the present invention to control high speed digital pulse parameters in a switching circuit including hot carrier diodes for establishing signal voltage limits.

It is a further object of the present invention to control high speed pulse parameters in a switching circuit including a programmable constant current source and a plurality of hot carrier diodes for establishing signal voltage limits.

A still further object of the present invention is to control high speed pulse parameters in a digital switching circuit including a constant current generator, hot carrier diodes for establishing signal voltage limits, a switching circuit controlled by a current mode switch and a complementary emitter follower output circuit for supplying current to a load.

Accordingly, these and other objects of the present invention are achieved in a digital switching circuit which includes a switching circuit responsive to a digital input signal and having an on state and an off state, first and second hot carrier diodes connected respectively to first and second limit voltages, a constant current generator for supplying current to said switching circuit and an output circuit for supplying current to a load.

It is a feature of the present invention that constant current generator may be programmed to generate a predetermined current by controlling circuit resistance values.

The foregoing and other objects, features and advantages of the invention will be apparent from the following more particular description of a preferred embodiment of the invention as illustrated in the accompanying drawing.

DETAILED DESCRIPTION OF THE INVENTION

Figure 1:
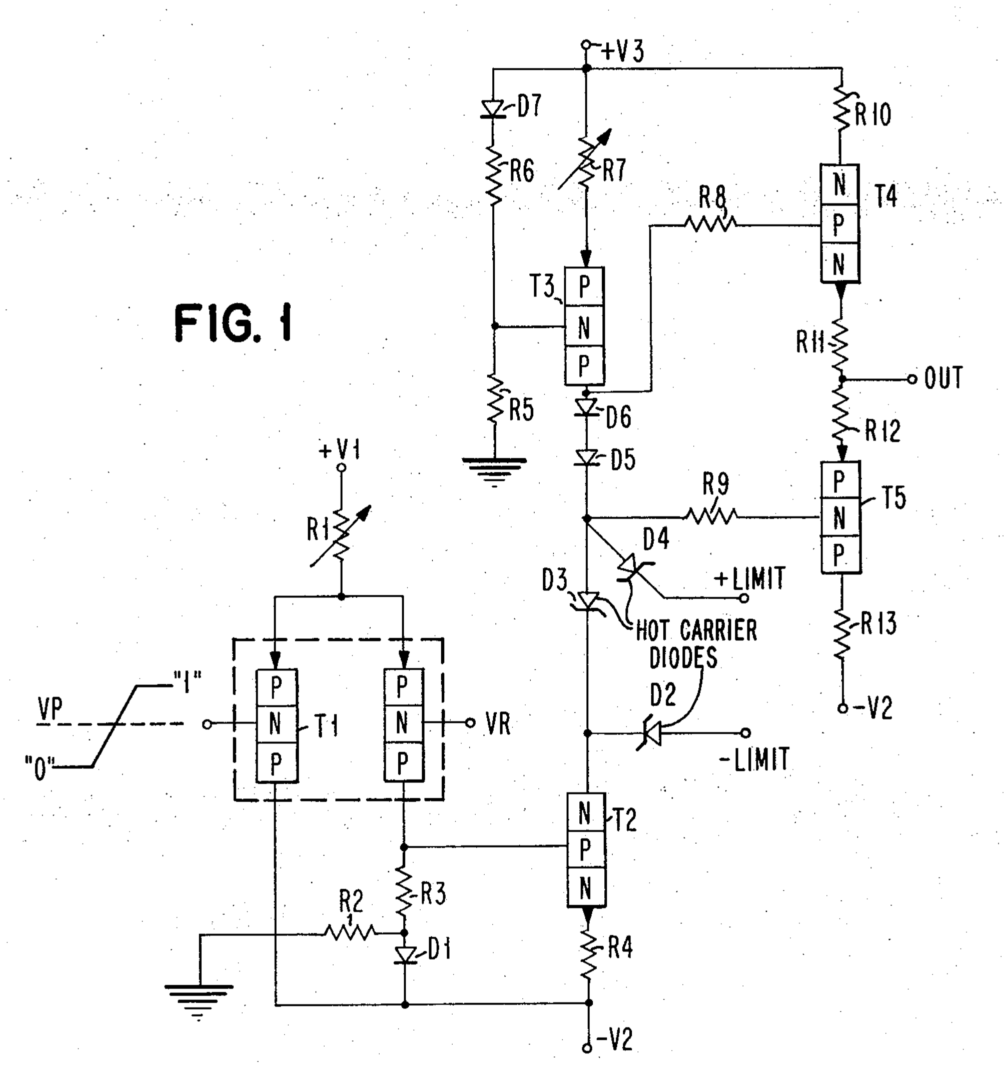
FIG. 1 is a schematic circuit diagram of a switching circuit embodying the present invention.

Referring to FIG. 1, a high speed programmable driver circuit is shown which embodies the present invention.

Common mode current switch T1 has common emitters connected through a programmable resistor R1 to a first voltage source V1. One base of T1 is connected to the input voltage signal and the second base is connected to a reference potential. As shown in the drawing, the input signal is averaged about the reference voltage level. The collector of the input portion of T1 is connected to a second voltage V2.

The collector of the reference portion of T1 is connected to the base of switching transistor T2 and to load circuit R3, R2 and clamping diode D1. Resistors R2 and R3 form a voltage divider to control the amount of signal applied to the base of switching transistor T2. The emitter of transistor T2 is connected to voltage source V2 through emitter transistor R4. The collector of switching transistor T2 is connected to cathodes of hot carrier diodes D2 and D3 respectively. the anode of hot carrier diode D2 is connected to a minus limit voltage. The anode of hot carrier diode D3 is connected to a junction of the anode of hot carrier diode D4, resistor R9 and the cathode of voltage offset diode D5.

The cathode of hot carrier diode D4 is connected to the positive limit voltage. R9 is connected to the base of transistor T5 which is part of the complementary emitter follower output stage. The anode of voltage offset diode D5 is connected to the cathode of voltage offset diode D6 which has its anode connected to the collector of constant current generator T3. Bias for constant current generator T3 is established by resistors R5, R6 and diode D7 connected between voltage source V3 and ground. The amount of current generated by constant current generator T3 may be controlled by variable resistor R7 which is connected in the emitter circuit of transistor T3 to voltage source V3.

The collector of T3 is further connected to resistor R8 which has another end thereof connected to the base of transistor T4 which is also part of the complementary emitter follower output stage. The complementary emitter follower output stage is formed with transistors T4 and T5 in series with resistors R10, R11, R12 and R13 connected between voltage sources V3 and V2 respectively, and the output signal for the circuit is taken at the junction of resistors R11 and R12 as shown in FIG. 1.

OPERATION

Figure 2:
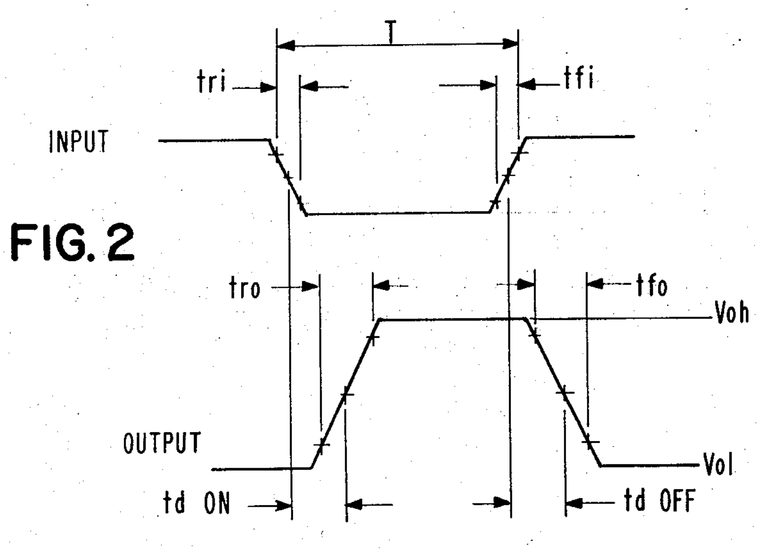
FIG. 2 is a timing diagram showing the input and output pulse parameters.

Referring now to both FIG. 1 and FIG. 2, the operation of the switching circuit described above will be shown in greater detail.

A constant current is generated by constant current generator T3 dependent upon the value of resistor R7 and the bias resistors R5 and R6. This constant current flows through voltage offset diodes D5 and D6 and through either hot carrier diode D4 to the positive limit voltage source or through hot carrier diode D3 depending on the state of transistor T2. Transistor T2 is never turned off; however, it does go from a low current state to a high current state. In its low current state, T2 is operating near cut-off and in its high current state, it is operating well up in the active region.

Switching transistor T2 is controlled by current mode switch T1. When the transistor on the VR side of switch T1 is off, resistor R2 supplies current to diode D1 to bias transistor T2 just barely on so that it never turns off.

When transistor T2 is in its high current state, a current $I_{T3}$ flows from the constant current generator T3 to the collector of T2 and an equal current flows from the minus limit voltage source through hot carrier diode D2 so that the total collector current of $I_{T2}$ and its on state is equal to $2I_{T3}$.

When T2 is in the low current state, the constant current $I_{T3}$ flows through hot carrier diode D4 to the positive limit voltage source to establish the positive limit on the output voltage signal. As is well known in the art, hot carrier diodes have a zero turn-off delay and practically a zero turn-on delay. Thus, hot carrier diodes D2, D3 and D4 allows the total delay through the driver circuit to be at a minimum.

The output stage consisting of transistors T4 and T5 and associated components, is a well-known complementary emitter follower circuit. Diodes D5 and D6 provide a direct current offset voltage which establishes standby current for the base of T4 and T5. These transistors operate in the active region rather than as on-off switches. The standby current is dependent upon the voltage match between the voltage drops across diodes D5 and D6 and the base emitter voltages of transistors T4 and T5. Resistors R11 and R12 limit standby current.

Since transistors T4 and T5 operate in the active region, the circuit is capable of high speed operation without crossover distortion.

The use of hot carrier diodes to control the pulse parameters such as turn-on and turn-off delay gives the circuit embodying the present invention a reliability and consistency of operation which is not found in the prior art. The input and output pulse parameters are shown in FIG. 2. For the negative input pulse, *tri* and *tfi* indicate the rise time delay and the fall time delay, respectively. For the positive output pulse, *tro* and *tfo* indicate the rise time delay and the fall time delay, respectively. Also, the output pulse turn-on delay and turn-off delay are indicated by *td* ON and *td* OFF, respectively. Voh indicates the upper limit of the output voltage and Vol the lower limit.

While the invention has been particularly shown and described with reference to a preferred embodiment thereof, it will be understood by those skilled in the art that the foregoing and other changes in form and detail may be made therein without departing from the spirit and scope of the invention.

What is claimed is:

1. A circuit, for controlling turn-on and turn-off delays of a digital switching circuit, comprising:
   - means for generating a constant current;
   - a first hot carrier diode connected between said constant current generator means and a first limit voltage;
   - a second hot carrier diode connected to a second limit voltage for establishing a second voltage limit;
   - switch means connected to said second hot carrier diode and to a first element of a third hot carrier diode which has a second element thereof connected to a junction of said constant current generator and said first hot carrier diode;
   - wherein said first hot carrier diode establishes a first voltage limit for an output signal and said second hot carrier diode establishes a second voltage limit for said output signal, and
   - wherein said first and second hot carrier diodes control circuit turn-on and turn-off delays within predetermined limits.

* * * * *